US010048089B2

(12) United States Patent
Julicher et al.

(10) Patent No.: US 10,048,089 B2
(45) Date of Patent: Aug. 14, 2018

(54) DIGITAL PERIOD DIVIDER

(71) Applicant: Microchip Technology Incorporated, Chandler, AZ (US)

(72) Inventors: Joseph Julicher, Maricopa, AZ (US); Kevin Kilzer, Chandler, AZ (US); Cobus Van Eeden, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 736 days.

(21) Appl. No.: 14/608,753

(22) Filed: Jan. 29, 2015

(65) Prior Publication Data

US 2015/0219474 A1   Aug. 6, 2015

Related U.S. Application Data

(60) Provisional application No. 61/934,218, filed on Jan. 31, 2014.

(51) Int. Cl.

| | |
|---|---|
| *G01D 5/26* | (2006.01) |
| *G01D 5/14* | (2006.01) |
| *G01P 3/481* | (2006.01) |
| *G01P 3/489* | (2006.01) |
| *H03K 21/38* | (2006.01) |
| *H02P 23/22* | (2016.01) |
| *G01P 3/486* | (2006.01) |
| *G01P 3/488* | (2006.01) |

(Continued)

(52) U.S. Cl.
CPC ............... *G01D 5/142* (2013.01); *G01D 5/26* (2013.01); *G01P 3/481* (2013.01); *G01P 3/486* (2013.01); *G01P 3/488* (2013.01); *G01P 3/489* (2013.01); *H02P 6/16* (2013.01); *H02P 23/22* (2016.02); *H03K 21/38* (2013.01); *G01D 5/2451* (2013.01)

(58) Field of Classification Search
CPC ........ G01D 5/142; G01D 5/26; G01D 5/2451; H02P 23/22; H02P 6/16; H03K 21/38; G01P 3/488; G01P 3/486; G01P 3/489
USPC .......................................................... 702/151
See application file for complete search history.

(56) References Cited

U.S. PATENT DOCUMENTS

| | | | |
|---|---|---|---|
| 4,166,976 A | 9/1979 | Ruhnau et al. | 324/166 |
| 4,408,290 A | 10/1983 | Kubo et al. | 702/141 |

(Continued)

FOREIGN PATENT DOCUMENTS

| | | | |
|---|---|---|---|
| JP | 2009294199 A1 | 12/2009 | G01P 3/489 |

OTHER PUBLICATIONS

International Search Report and Written Opinion, Application No. PCT/US2015/013513, 21 pages, dated Jun. 30, 2015.

(Continued)

*Primary Examiner* — Sujoy Kundu
*Assistant Examiner* — Lynda Dinh
(74) *Attorney, Agent, or Firm* — Slayden Grubert Beard PLLC

(57) ABSTRACT

A system may have a digital period divider generating an output signal that is proportional to an angle defined by a rotational input signal and an interval measurement unit determining an interval time of an interval defined by succeeding pulses of the input output signal. In an enhancement, the system may also have a missing pulse detector which is operable to compare a current interval with a parameter to determine whether a pulse is missing in the input signal.

31 Claims, 20 Drawing Sheets

(51) Int. Cl.
H02P 6/16 (2016.01)
G01D 5/245 (2006.01)

(56) References Cited

U.S. PATENT DOCUMENTS

| | | | | |
|---|---|---|---|---|
| 5,625,276 | A * | 4/1997 | Scott | B23K 9/1062 |
| | | | | 310/114 |
| 6,453,250 | B1 * | 9/2002 | Andersson | H03K 5/19 |
| | | | | 377/16 |
| 6,621,242 | B2 | 9/2003 | Huang et al. | 318/268 |
| 7,835,883 | B2 | 11/2010 | Takeuchi | 702/145 |
| 8,908,823 | B2 | 12/2014 | Julicher et al. | 377/39 |
| 2003/0062863 | A1 | 4/2003 | Huang et al. | 318/268 |
| 2005/0275568 | A1 * | 12/2005 | Madni | G01D 5/2053 |
| | | | | 341/50 |
| 2007/0273642 | A1 * | 11/2007 | Park | G06F 3/011 |
| | | | | 345/156 |
| 2008/0255796 | A1 | 10/2008 | Takeuchi | 702/147 |
| 2011/0200163 | A1 * | 8/2011 | Oda | G06F 1/3203 |
| | | | | 377/118 |

OTHER PUBLICATIONS

International Search Report and Written Opinion, Application No. PCT/US2014/022188, 11 pages, dated Jun. 27, 2014.

* cited by examiner

DIGITAL PERIOD DIVIDER

CROSS-REFERENCE TO RELATED APPLICATIONS

This application claims the benefit of U.S. Provisional Application No. 61/934,218 filed on Jan. 31, 2014, which is incorporated herein in its entirety. This application is further related to U.S. application Ser. No. 14/200,317 which issued as U.S. Pat. No. 8,908,823.

TECHNICAL FIELD

The present disclosure relates to a digital period divider.

In digital applications there is often a need to precisely divide an unknown period. For example a period determined by the rotation of a motor needs to be divided into 360 steps wherein each step indicates a rotation of one degree. Other signals such a power mains signal frequency of 50 or 60 Hz may need a similar processing. In particular incoming "rotation" signals may provide one pulse per revolution or multiple pulses per revolution. In the latter case one period may be longer than the rest, for example when a double notched sensor wheel is used or a flywheel, for example, with a missing teeth for indicating a top dead center position.

SUMMARY

According to an embodiment, a system may comprise a digital period divider generating an output signal that is proportional to an angle defined by a rotational input signal, an interval measurement unit determining an interval time of an interval defined by succeeding pulses of the output signal, and a missing pulse detector operable to compare a current interval with a parameter to determine whether a pulse is missing in the input signal.

According to a further embodiment, the parameter can be a predetermined time value. According to a further embodiment, the parameter can be defined by a previously measured interval and a predetermined factor by which the previously measured interval must be exceeded. According to a further embodiment, the system can be programmable to select whether an input signal comprises a missing pulse in which case the interval measurement unit and missing pulse detector are enabled. According to a further embodiment, a sensor may providing the input signal can be selected from being a zero-cross detector, a notched wheel sensor, a double-notched wheel sensor and a flywheel teeth sensor. According to a further embodiment, the system may further comprise an output generating the missing pulse. According to a further embodiment, the digital period divider may comprise a first counter comprising R least significant bits (LSB) and P most significant bits (MSB) having a count input and a reset input, wherein the count input receives a first clock signal and the reset input receives a second clock signal; a latch having P bits and being coupled with the P bits of the first counter; a second counter having P bits comprising a count input and a reset input, wherein the count input receives the first clock signal; and a first comparator operable to compare the P bits of the latch with the P bits of the second counter and generating an output signal, wherein the output signal is also fed to the reset input of the second counter. According to a further embodiment, the first counter may comprise an MSB counter and an LSB counter connected in series, wherein the LSB counter is a modulo counter. According to a further embodiment, the first clock signal can be a known system clock and the second clock signal is a signal having an unknown frequency smaller than the system clock.

According to another embodiment, a system comprising the digital period divider as described above, may further comprise a third counter having P bits and comprising a reset input and a count input, wherein the reset input receives the second clock signal and the count input receives the output signal of the first comparator; a user value register; a second comparator operable to compare the value of the third counter and the user value register; and a flip-flop having a set and reset input, wherein the set input receives the first clock signal and the reset input receives an output signal of the second comparator. According to a further embodiment of the above system, the second clock signal can be generated by a sensor coupled with a motor which generates at least one pulse per full rotation of the motor shaft. According to a further embodiment of the above system, the sensor can be a Hall or optical sensor.

According to yet another embodiment, a method for dividing a period of an unknown frequency may comprise the steps of: receiving a series of index pulses; measuring a time between two successive index pulses by means of a first counter having P most significant bits and R least significant bits and being clocked by a system clock; comparing a current interval with a parameter to determine whether a pulse is missing in the input signal; and generating a missing pulse signal if the missing pulse is detected.

According to a further embodiment of the above method, the parameter is a predetermined time value. According to a further embodiment of the above method, the parameter can be defined by a previously measured interval and a predetermined factor by which the previously measured interval must be exceeded. According to a further embodiment of the above method, the method may further comprise the step of selecting a type of input signal which enable or disable a missing pulse detection. According to a further embodiment of the above method, the method may further comprise the steps of latching the most significant bits, and comparing the latched value with a second counter being clocked by the system clock and generating output pulses when the second counter is equal to the latched most significant bits. According to a further embodiment of the above method, the first counter may comprise an MSB counter and an LSB counter connected in series, wherein the LSB counter is a modulo counter. According to a further embodiment of the above method, the method may further comprise the step of generating a pulse width modulation (PWM) signal from the output pulses. According to a further embodiment of the above method, the index pulse can be generated by a rotary machine, and wherein the measured period is a period of rotation. According to a further embodiment of the above method, the method may further comprise the step of clocking a third counter having P bits with the index pulses and resetting the third counter with the output pulses; compare a value of the third counter with a user value; and setting a flip-flop with the index pulses and resetting the flip-flop when the third counter is equal the user value. According to a further embodiment of the above method, the index pulses can be generated by a sensor coupled with a motor. According to a further embodiment of the above method, the sensor can be selected from being a zero-cross detector, a notched wheel sensor, a double-notched wheel sensor and a flywheel teeth sensor. According to a further embodiment of the above method, the sensor may generate at least one pulse per full rotation of a motor shaft. According to a further embodiment of the above method, the sensor can be a Hall or optical sensor. According to yet another embodiment, a system may comprise a digital period divider generating an output signal that is proportional to an angle defined by a rotational input signal, and an interval measurement unit determining an interval time of an interval defined by succeeding pulses of the input output signal.

According to a further embodiment of the above system, the system may further comprise a missing pulse detector operable to compare a current interval with a parameter to determine whether a pulse is missing in the input signal, and wherein the system is programmable to select whether an input signal comprises a missing pulse in which case the interval measurement unit and missing pulse detector are enabled. According to a further embodiment of the above system, a sensor providing the input signal can be selected from being a zero-cross detector, a notched wheel sensor, a double-notched wheel sensor and a flywheel teeth sensor. According to a further embodiment of the above system, the digital period divider may comprise a first counter comprising R least significant bits (LSB) and P most significant bits (MSB) having a count input and a reset input, wherein the count input receives a first clock signal and the reset input receives a second clock signal; a latch having P bits and being coupled with the P bits of the first counter; a second counter having P bits comprising a count input and a reset input, wherein the count input receives the first clock signal; and a first comparator operable to compare the P bits of the latch with the P bits of the second counter and generating an output signal, wherein the output signal is also fed to the reset input of the second counter. According to a further embodiment of the above system, the first counter may comprise an MSB counter and an LSB counter connected in series, wherein the LSB counter is a modulo counter. According to a further embodiment of the above system, the first clock signal can be a known system clock and the second clock signal is a signal having an unknown frequency smaller than the system clock.

According to yet another embodiment, a system comprising the digital period divider as described above may further comprise: a third counter having P bits and comprising a reset input and a count input, wherein the reset input receives the second clock signal and the count input receives the output signal of the first comparator; a user value register; a second comparator operable to compare the value of the third counter and the user value register; and a flip-flop having a set and reset input, wherein the set input receives the first clock signal and the reset input receives an output signal of the second comparator. According to a further embodiment of the above system, the second clock signal can be generated by a sensor coupled with a motor which generates at least one pulse per full rotation of the motor shaft. According to a further embodiment of the above system, the sensor can be a Hall or optical sensor.

According to yet another embodiment, a microcontroller may comprise a central processing unit (CPU), a plurality of timers, a programmable logic unit configurable under program control to form at least one logic element, a capture compare peripheral, an internal system bus coupling the CPU, the plurality of timers, the programmable logic unit, and the capture compare peripheral, and a programmable internal routing logic operable to connect the plurality of timers, the programmable logic unit, and the capture compare peripheral such that a digital period divider is formed generating an output signal that is proportional to an angle defined by a rotational input signal and an interval measurement unit determining an interval time of an interval defined by succeeding pulses of the output signal.

DETAILED DESCRIPTION

According to various embodiments, a digital period divider may be configured to generate a pulse train which divides a typical period/interval into a plurality of pulses and to detect when one interval exceeds a predefined threshold, for example by 50% of a typical measured interval. The exception can be identified by a fixed amount of time, for example 40 milliseconds, or by comparison to previously measured intervals.

For example as mentioned above, with an engine flywheel, a detector emits a series of equally-spaced pulses, except one is missing. The missing pulse can be coincident with the "top-dead-center" (TDC) position of the engine rotation, so detection may be tantamount to locating TDC in time.

The detector is incorporated into an angular timer (a.k.a. Digital Period Divider), which provides the timer for measuring the pulse interval.

Figure 1:
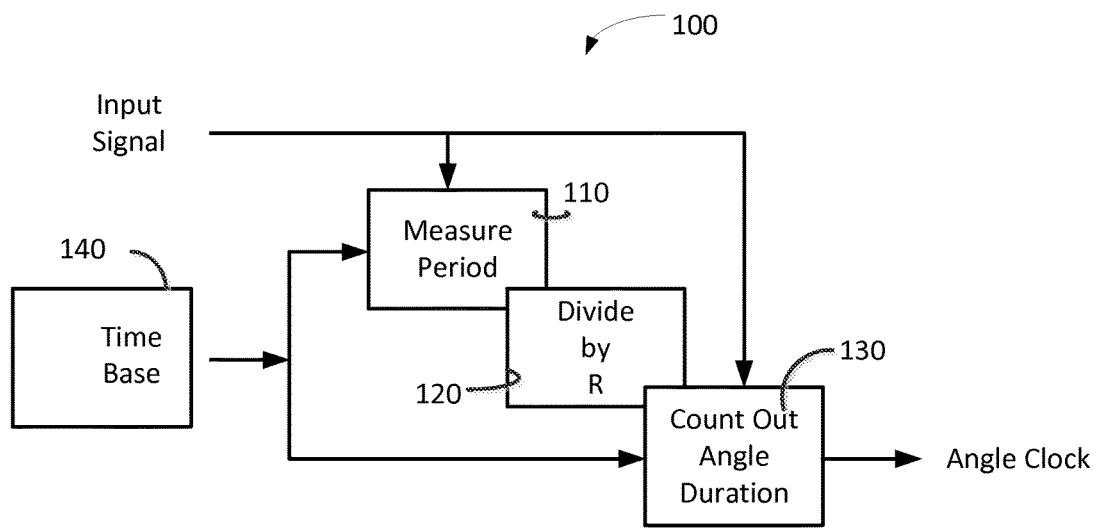
FIG. 1 shows a block diagram of a digital period divider.
Figure 2:
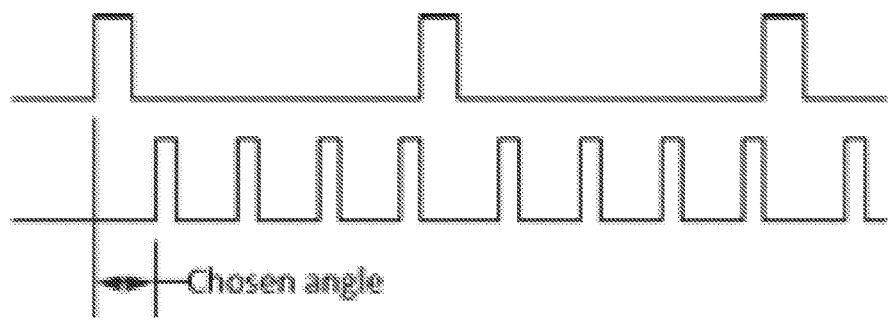
FIG. 2 shows respective input and output signals of a digital period divider according to an embodiment.

FIG. 1 shows a block diagram of a digital period divider 100 operational to generate an angle clock signal from an input signal. The period of the input signal is measured by measurement unit 110 and divided by R by unit 120. A counter 130 operating at a higher frequency provided by timebase 140 counts out the angle duration. A user can select the angle parameter of the angle clock output signal. FIG. 2 shows associated timing diagram wherein the top signal represents pulses received that represent a full rotation. The bottom signal represents the angle clock, for example here a division by 90° has been chosen. As stated above, the signal period is measured with a fast clock provided by a time base 140 as shown in FIG. 1. Then, the measurement count is divided by a number of angles/revolution and a pulse train of equal intervals is generated.

Figure 3:
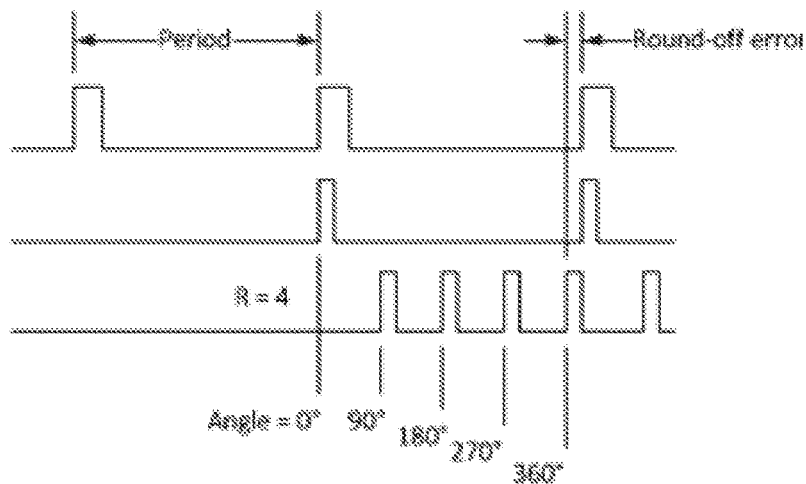
FIGS. 3 and 4 show a more detailed embodiment of a digital period divider and associated input output signals.
Figure 4:
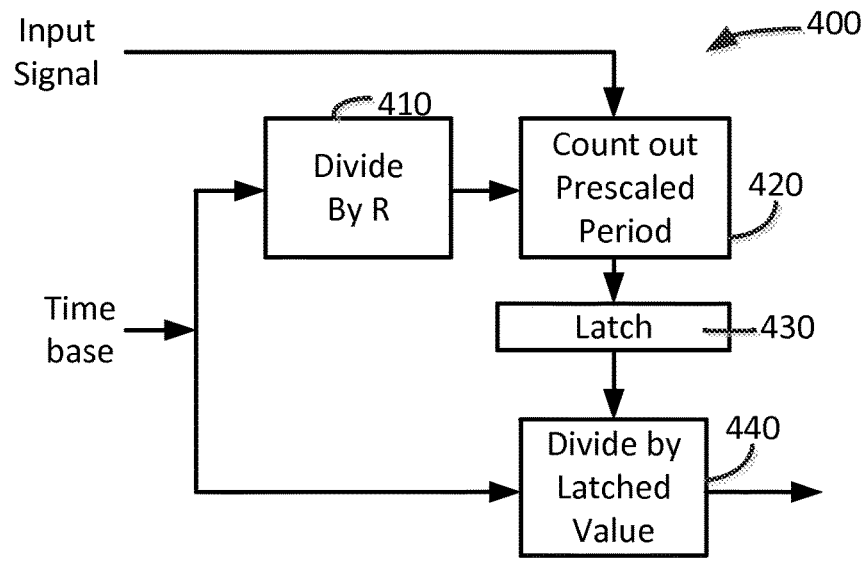

According to an implementation as shown in FIG. 3, a measured period may be represented by R*P, wherein R is the number of angles per revolution. Again, in the example shown in FIG. 3, the period is divided into four angle sections each representing 90°. FIG. 3 also shows a round off error which may depend on the resolution provided by the time base signal. FIG. 4 shows an associated block diagram of such a period divider.

The input signal is fed to a counter unit 420 which counts out a pre-scaled period. To this end, a time base clock is divided by R through divider 410. The output signal from counter unit 420 is latched by latch 430. A divider 440 receiving the time base clock divides the time base clock by the latched value to generate the output signal.

Figure 5:
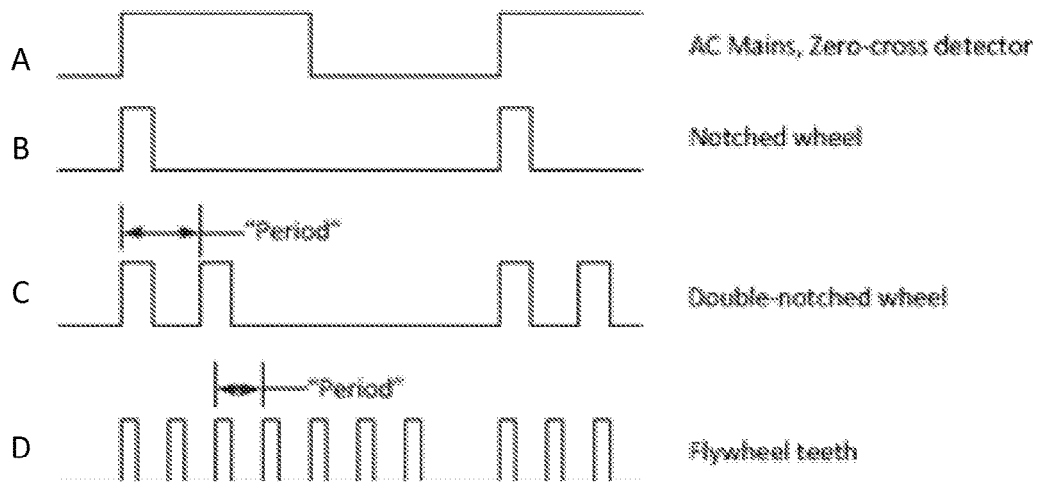
FIG. 5 shows examples of various input signals for a digital period divider.

FIG. 5 shows typical output signals provided by various devices that can be used as an input signal of the digital period divider. The digital period divider may be programmable to be able to operate with any type of signal as shown in FIG. 5. For example signal A in FIG. 5 represents the output of a zero-cross detector coupled with an AC mains signal. Signal B may be provided by a notched wheel. Signal C may be provided by a double-notched wheel and the signal D may be provided by a toothed flywheel, which has a missing tooth.

Figure 6:
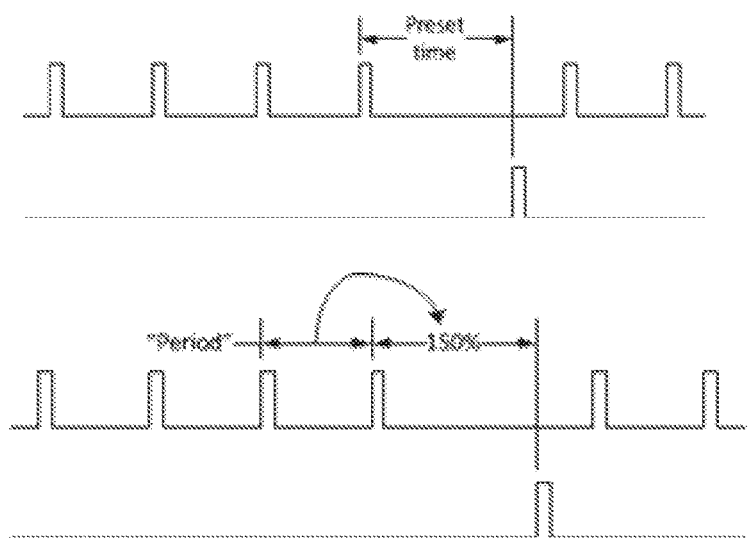
FIG. 6 shows a timing diagram for detection of a missing pulse.

FIG. 6 explains how a digital period divider may detect missing pulses to be operable to use the input signals of the third and fourth type as shown in FIG. 5 (signals C and D). The short intervals are measured and their duration is stored to determine when a long interval occurs. As a hardware compromise, the full period may not be measured. Rather, the period is divided into multiples of the short interval. The missing pulse may be detected based on a user defined time. In other words when a predefined number of clock cycles provided by the time base occurs without a reset caused by the input signal, a missing pulse is determined and can be generated as shown in the top of FIG. 6. The bottom diagram shows an adaptive measurement according to another embodiment, wherein a period time is determined by previously measured intervals. When a currently measured interval exceeds a predetermined amount, for example 150%, then a missing pulse is determined and can be generated as shown in the bottom half of FIG. 6.

Figure 7:
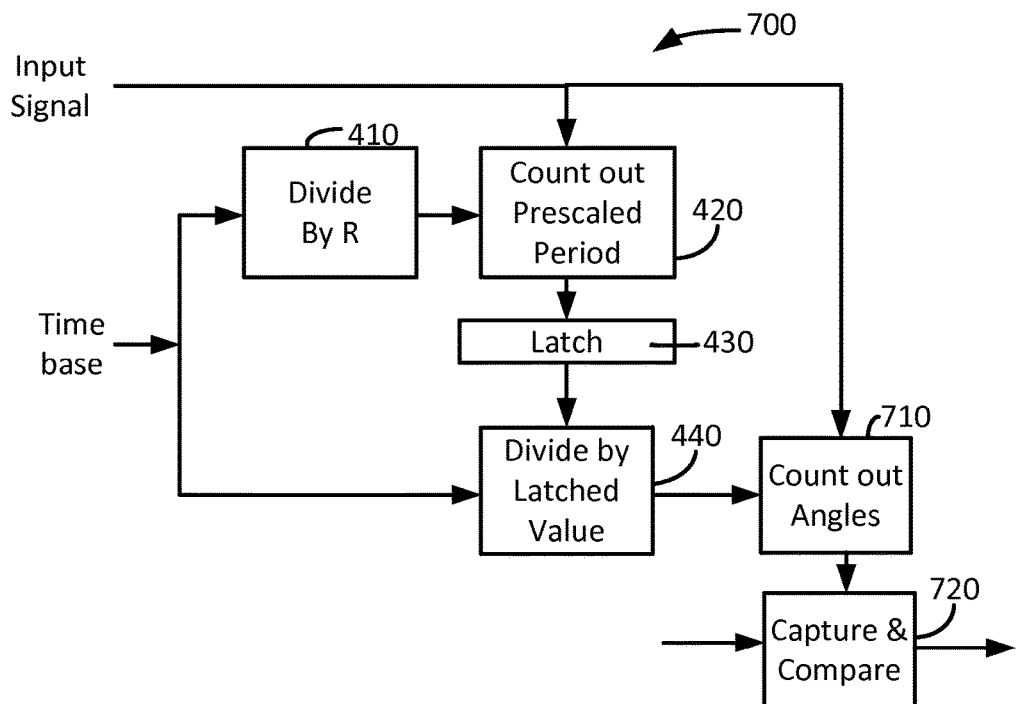
FIGS. 7 and 8 show an angle counter and associated input output signals according to an embodiment.
Figure 8:
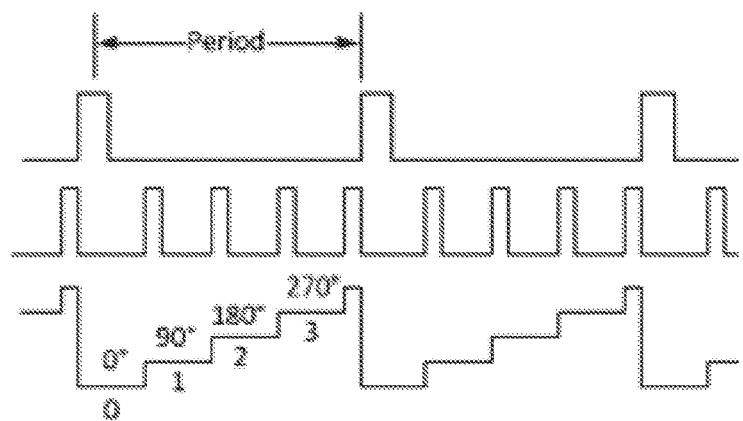

FIG. 7 shows an angle counter 700 according to an embodiment and FIG. 8 shows associated input and output signals. The angle counter can be configured to count out the angles as discussed above. For example, a system as shown in FIG. 4 is used with an additional counter unit 710 operable to count out the angles. Unit 710 receives the input signal and the output signal of divider 440. A capture & compare unit 720 receives the output value from counter unit 710 and a threshold value and generates an output signal as a result of the comparison. Thus, because it is known when the signal begins each angle is marked and a count value can be generated that is proportional to the angle. As shown in FIG. 7, the capture & compare unit 720 is connected to the output signal that counts out the angles to perform this function.

Figure 9:
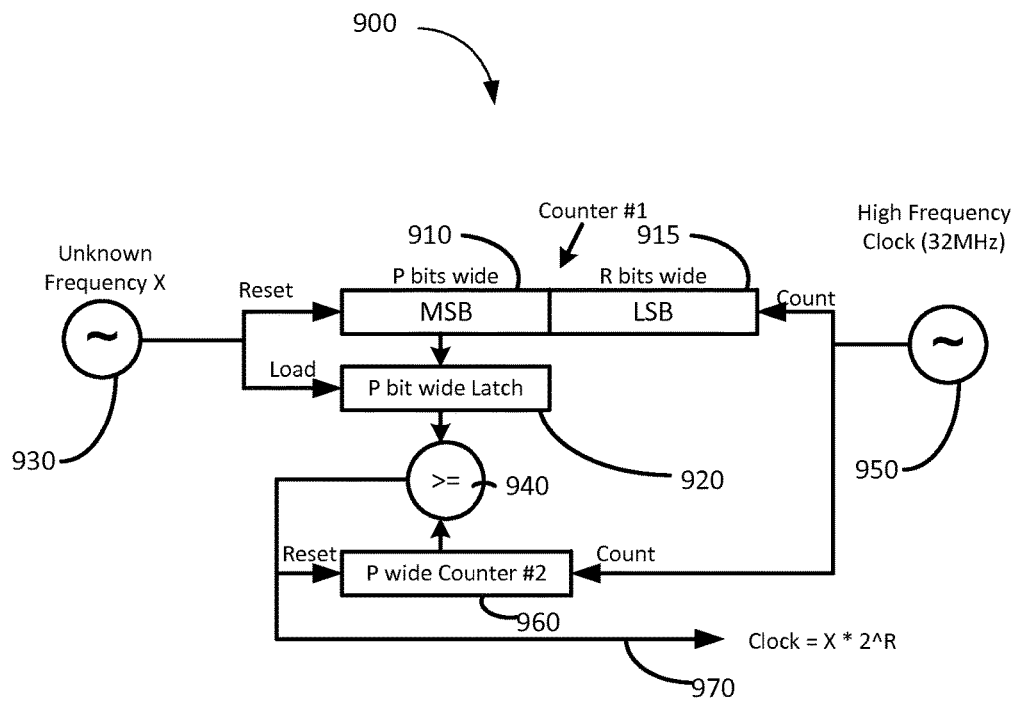
FIG. 9 shows a block diagram of a digital period divider.

FIG. 9 shows a block diagram of a digital period divider according to various embodiments. A first counter can be formed by two counters 910 and 915 wherein the first counter having P bits concatenates with a second counter 915 having R bits. Thus, counter 910 provides the most significant bits (MSB) and counter 915 the least significant bits (LSB). However, according to other embodiments a single counter having P+R bits may be used. In case two counters are used, the overflow of counter 915 clocks the input of counter 910. A high frequency clock source 950 is provided, for example a 32 MHz system clock, that provides the count clock input signal for the first counter 910, 915. The first counter (or the combined counters 910, 915) have a reset input that receives the unknown frequency X from a frequency source 930. A latch 920 having P bits is coupled with counter 910 and therefore with the MSB of the first counter. The unknown frequency triggers the load input of latch 920. A second counter 960 having P bits receives the clock signal of the system clock at its count input. A comparator 940 is provided that compares the value of the latch 920 and the count value of the second counter 960. If equal, the output of comparator 940 goes high (or low) and may be used to reset the second counter. Also, the output signal of comparator provides the divided clock signal $X*2^R$.

It is widely accepted that sine, cosine and tangent computations are necessary when controlling rotary machines, but according to various embodiments a rotation pulse-to-angle conversions is provided.

Figure 11:
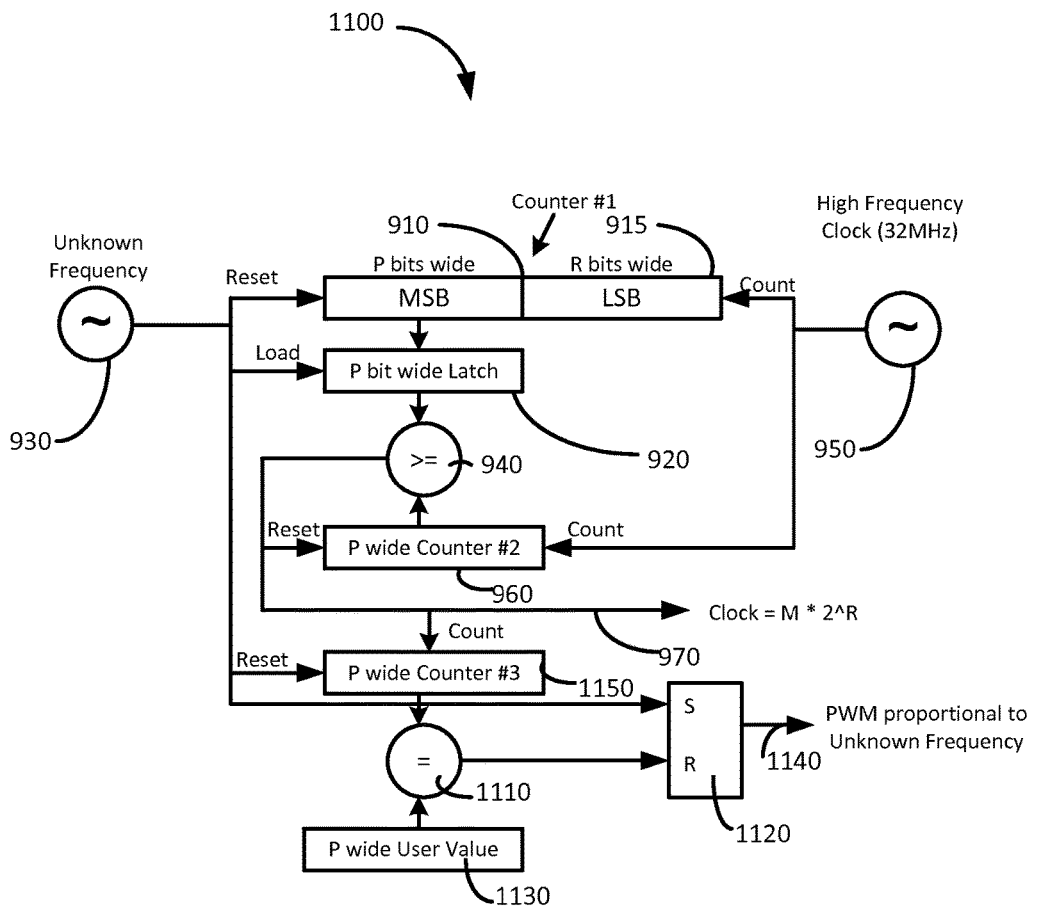
FIG. 11 shows a first application embodiment using the period divider of FIG. 9.

Referring to FIG. 11, a first application 1100 of the period divider 900 shown in FIG. 9 is provided. As mentioned above, an unknown frequency M, for example of a motor or other rotary machine 930, is provided to the period divider 1100. The circuit 910, 915, 920, 940, 950, and 960 measures the period of rotation, and create a clock 970 that is a fixed multiple of the rotational frequency. Typically, this might be one clock per degree of rotation (that is, times 360), or any convenient multiple. The system may be applied to motor systems or to systems like AC power lines with a frequency of 50 or 60 Hz or any other unknown frequency signal.

With reference to the FIG. 11, the system 1100 requires 2 inputs. The unknown frequency input, for example motor-pulse, supplies a reference indicating in case of a motor 930 that the motor 930 has turned one revolution. Such a signal can be obtained for example from a Hall-effect sensor or optical interrupter as will be discussed in more detail below. Some applications may supply more than one pulse per revolution, and for discussion we take this as M cps (cycles per second). The other input is a fixed clock source 950 of any convenient frequency, as long as it is much faster than the expected output signal. For example, a 6000 RPM motor produces an input of 100 cps, and if the machine is set to multiply by 360 (one clock per degree of rotation), the output will be 36000 Hz. The clock source of a 32 MHz clock signal 950 is almost 1000× faster, so is adequate.

As mentioned above, the first counter can be actually two counters 915 and 910 according to some embodiments. Counter 915 advances with each clock pulse, and is illustrated having R bits for a modulo $2^R$ count. The counter 915 could be any modulo, like 360 or 180, and for discussion we say that counter 915 has modulo R. Counter 920 holds P bits and advances every time counter 915 rolls over. Taken together, these counters 915, 910 count the number of clock pulses required for 1 revolution of the motor. With each revolution, the present value of counter 910 is captured in the latch 920, and the entire first counter 915, 910 is reset to zero. Mathematically, the latch 920 receives a value which is the total number of clock pulses per revolution divided by R, updated with every cycle of the unknown frequency. The size of the counter 910 (value of P) should be chosen to prevent counter overflow knowing M and the clock frequency. Simultaneously, the second counter 960 advances with each clock pulse, and counts until it reaches a value equal to the latched value. When equal, the equality logic 940 emits a single pulse and the second counter 960 resets to zero. As will be appreciated, the second counter 960 will do this a total of R times before the latched value changes, and so there will be R equality pulses emitted for each cycle of the unknown signal, for example the motor rotation signal. Thus, the goal of producing at the output 970 a clock train R times faster than the motor index pulse has been achieved, and the new clock train will change frequency as often as the motor speed changes, albeit one cycle later. The latency can be improved by configuring the motor to produce many pulses per revolution, and reducing R proportionately.

Also shown in FIG. 11 is a third counter 1150, a user-value register 1130 for storing a value UV, and an SR latch 1120. This represents logic that is similar to a conventional timer with PWM arrangement, except with the added ability to reset the third counter 1150 with every cycle of the unknown signal from source 930. Since the third counter 1150 is clocked R times per revolution, the counter value will advance from zero to (R−1) within each cycle of the unknown signal. In case the unknown signal is provided by a motor 930, assuming that the motor speed is relatively constant, the counter will be equal to the user value at a rotation angle of 360*(UV/R) degrees after the index pulse. It is highly significant that the user value UV is proportional to degrees, independent of the motor speed. This allows UV to represent an angle directly, without the sine, cosine or tangent computations normally required for conversion from the fixed-time measurements of traditional timers and PWMs to angular measurements (or vice versa). For AC power system, a value of UV=90 (degrees) would produce the same angular index regardless of whether a 50, 60 or even 400 Hz power system is being used.

Figure 12:
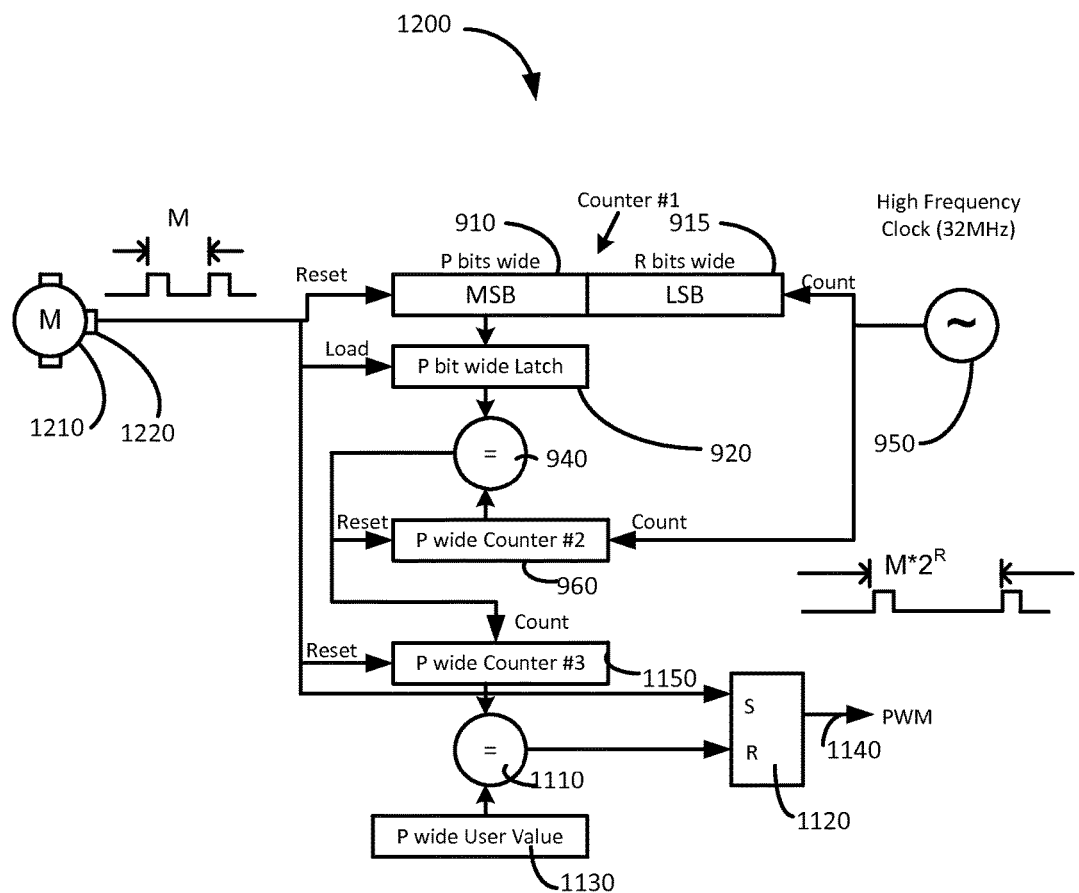
FIG. 12 shows another application using a period divider of FIG. 9.

FIG. 12 shows an example with a motor 1210 comprising, for example, a sensor 1220, for example a Hall sensor or optical sensor, capable of generating a pulse with each rotation of the motor shaft. This signal is used as the unknown frequency signal and fed to the period divider of FIG. 1 and the additional logic discussed in the embodiment of FIG. 11. Here, the reset signal generated by comparator logic 940 is only used to clock counter 1150. Flip-flop 1120 comprises output 1140 which provides for a user controlled pulse width modulation signal which can be directly controlled by a value proportional to the rotation degree.

The arrangements shown in the figures can be preferably realized within a microcontroller. To this end, a flexible timer comparator unit may be provided that allows for the shown arrangements. To this end, latch 920 may be formed by a capture unit coupled with a first counter and programmable routing may be provided that allows comparing the various values as shown in FIG. 12. For example, control registers within the microcontroller may allow to assign inputs of digital comparators to be assigned to timers or capture latches. Moreover, the microcontroller may include programmable logic, such as configurable logic cells that provide for combinatorial logic or various types of flip-flops or latches such as D flip-flop, JK flip-flop or SR latches. Such microcontrollers are manufactured by Applicant for example in the PIC10F32x and PIC1xF150X family.

Figure 13:
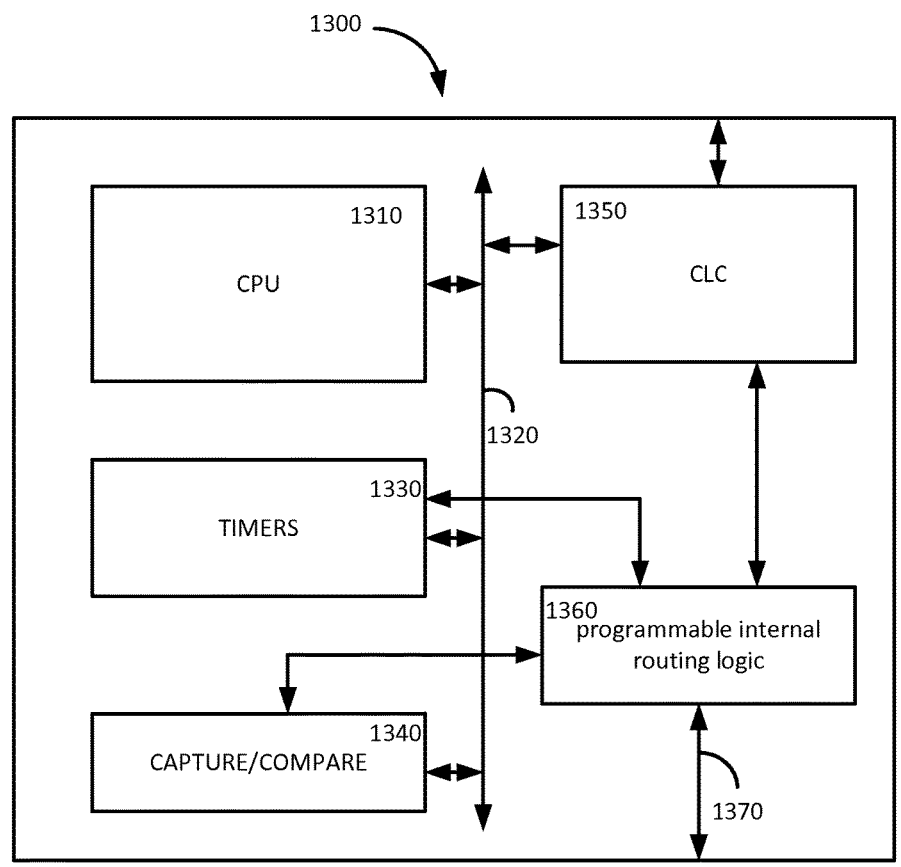
FIG. 13 shows a microcontroller designed to embody the period divider according to various embodiments.

FIG. 13 shows an exemplary microcontroller 1300 designed to be able to be programmed to form the functional units as shown in FIGS. 9, 11, and 12. Microcontroller 1300 comprises a central processing unit 1310 connected with an internal bus 1320. Various peripherals such as timers 1330, a capture compare unit (CCP) 1340 and configurable logic cells (CLC) 1350 may be available and coupled with the internal bus 1320. In addition, each peripheral may have programmable glue logic that allows to route internal signals to its various inputs, for example, internal or external signals may clock a timer. Two timers may be programmable to form a single concatenated timer, timer values may be coupled with inputs of the capture/compare unit (CCP), etc. Alternatively a central programmable internal routing logic 1360 may be provided that allows for the same function namely to assign the various internal or external signals to various inputs/outputs of the peripheral devices. The various peripherals may have special function registers that allow the selection of the various input/output signals. Even if a programmable internal routing logic 1360 is provided, such special function registers may be provided to control the unit 1360 wherein the special function registers may be associated with the respective peripheral unit. Thus, the unit 1360 may not be visible to a user as a separate peripheral. Thus, without any additional hardware, a period divider and/or additional logic as discussed above can be formed within the microcontroller 1300 under program control.

Figure 10:
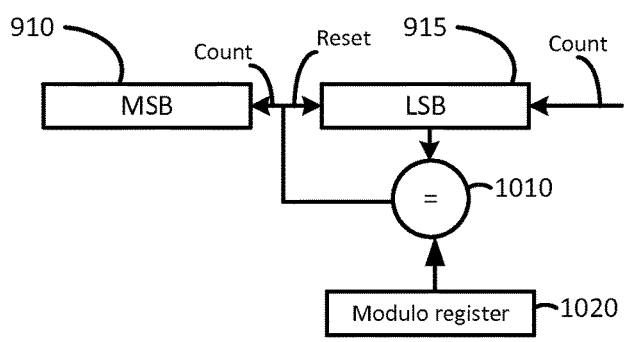
FIG. 10 shows an embodiment for a modulo counter which can be used as the LSB counter of the first counter of the period divider.

FIG. 10 shows an example of a modulo counter with a variable modulo. To this end, a modulo register 1020 is provided which can be programmed to contain the modulo value. A modulo comparator 1010 compares the value of LSB counter 915 with the value of the modulo register 1020 and generates a pulse each time the values are equal. This pulse is used to reset LSB counter 915 and clock MSB counter 910. The modulo register 1020 can be, for example, programmed to store a value of 180 or 360 or any other suitable value for dividing the period of the unknown frequency.

Figure 14:
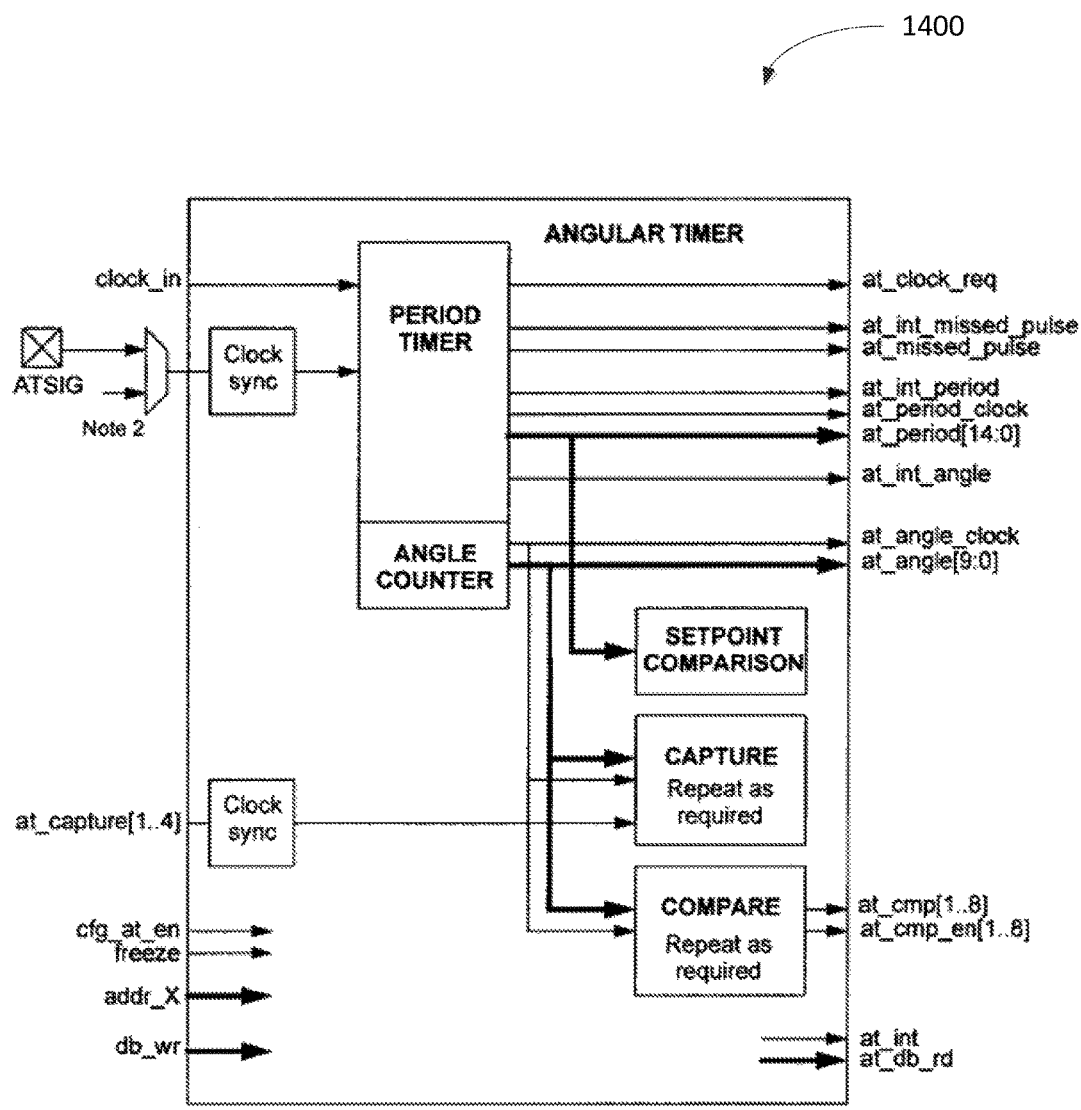
FIG. 14 shows a block diagram of an angular timer peripheral, for example, suitable for integration within a microcontroller.
Figure 15:
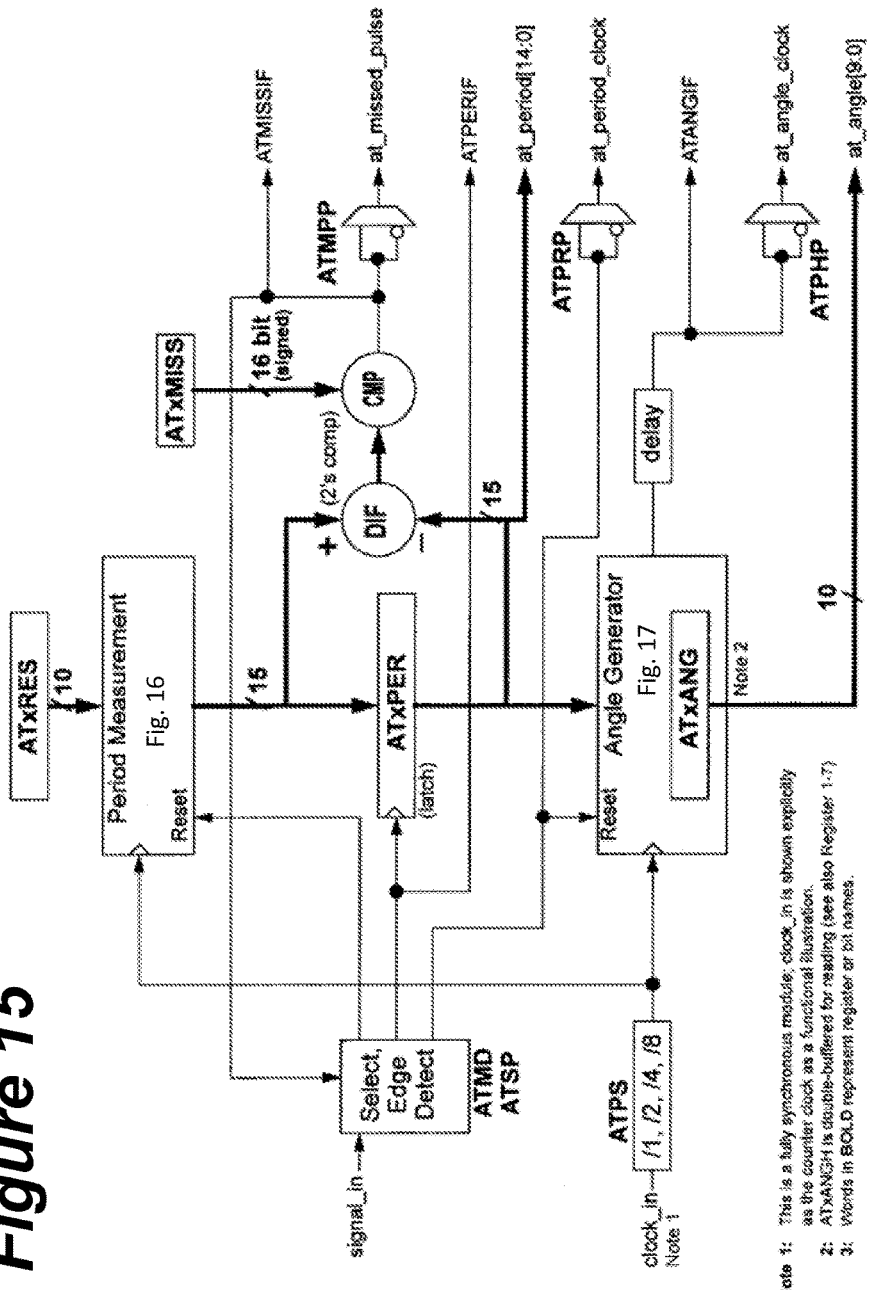
FIG. 15 shows a block diagram of the period timer and angle counter of the angular timer peripheral of FIG. 14.
Figure 17:
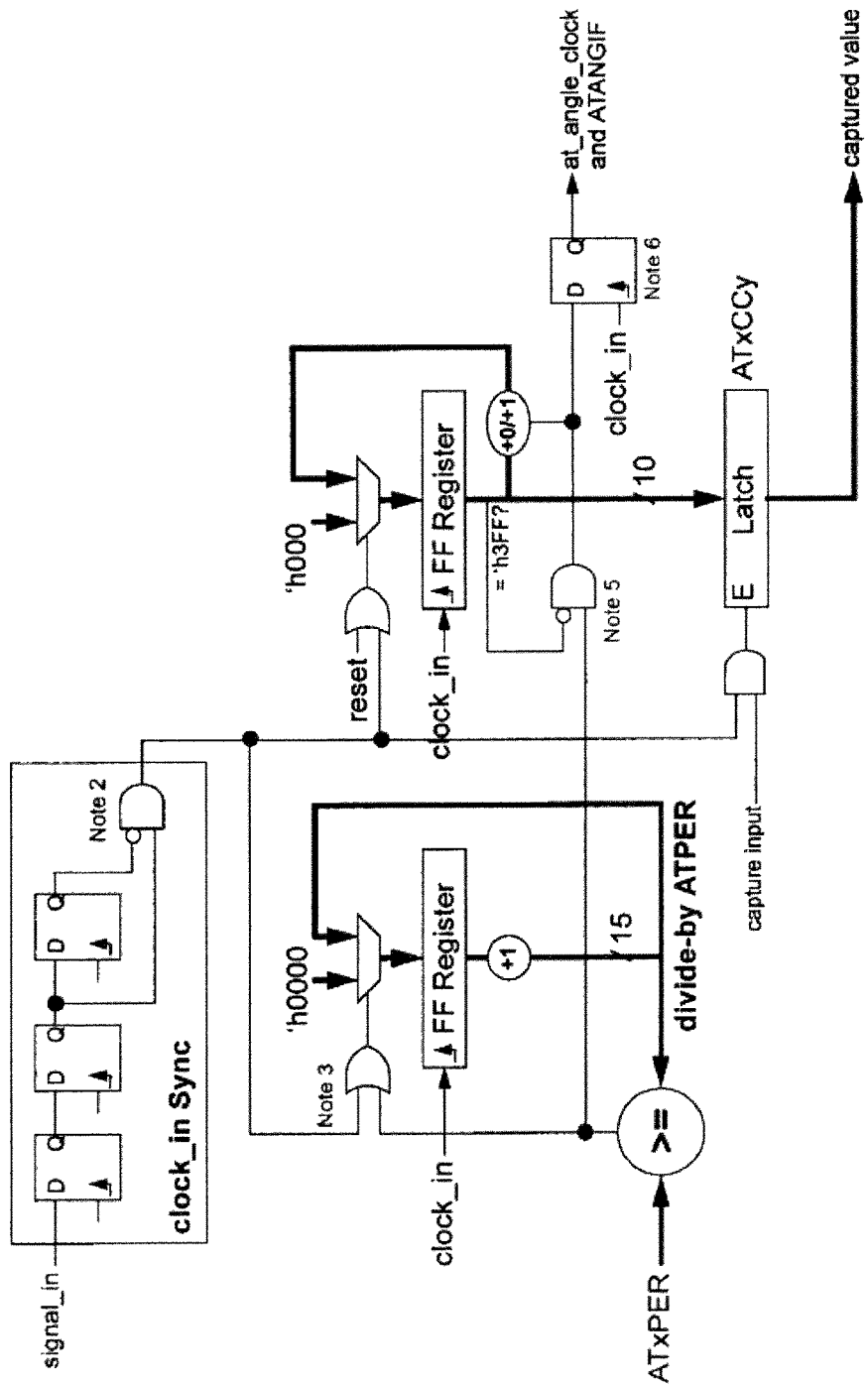
FIG. 17 shows details of the angle counter of the angular timer peripheral of FIG. 14.

FIG. 14 shows a specific embodiment of an angular timer 1400 according to various embodiments for integration within a microcontroller. The primary output of the angular timer is the angle clock, at_angle_clock (FIG. 15, FIG. 17). In the basic operating mode, the angle clock has a frequency which is a multiple of signal_in. Other modes provide other features. The angle clock may be output on an I/O pin, or used as the timebase for other device timers.

The angle clock is used within this module 1400 to generate the angle data value, at_angle[9:0], which can be read by software, used by capture and compare logic, or routed to other system capture/compare/PWM (CCP) or PWM devices. An interrupt is signaled for each angle clock pulse. The module 1400 also measures the period of the input signal. The measured period is compared to a setpoint value (ATxSTPT) to produce an error value (ATxERR).

Figure 16:
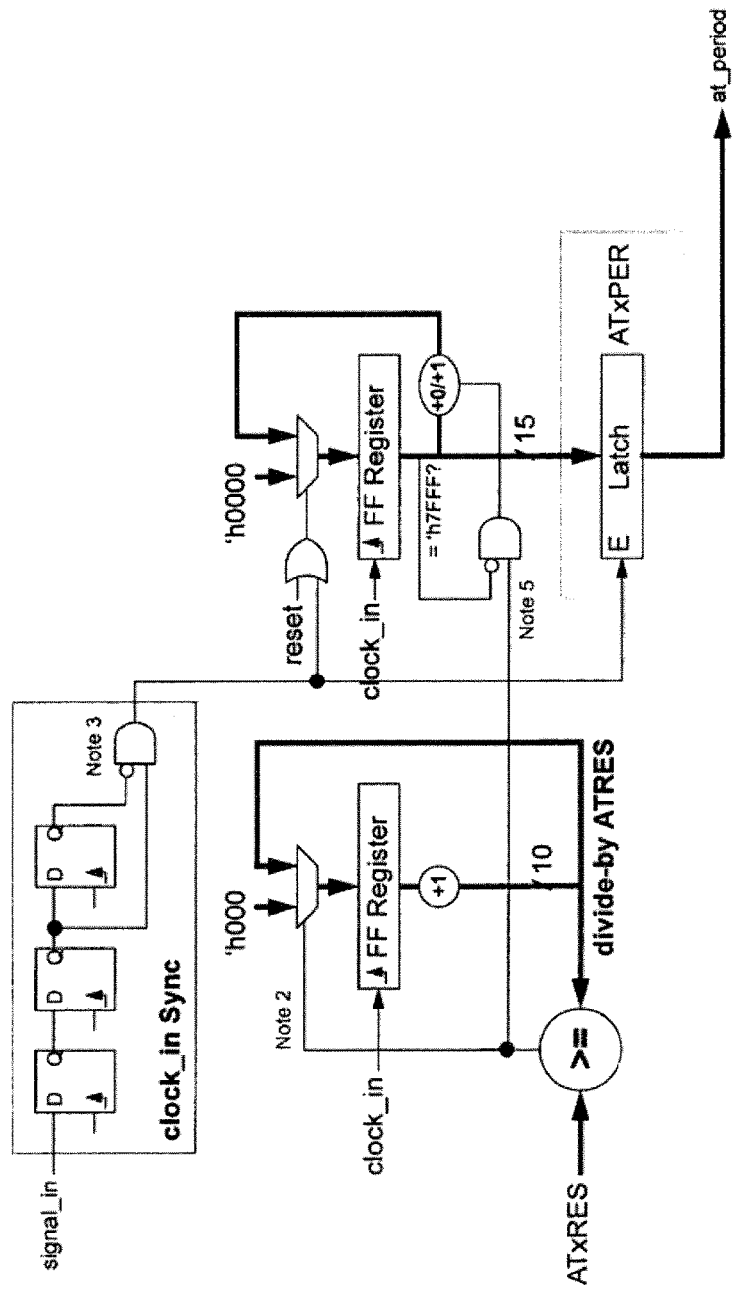
FIG. 16 shows details of the period timer of the angular timer peripheral of FIG. 14.

The basic timer is shown in FIG. 15, and period timer and angle counter details are elaborated in FIG. 16 and FIG. 17, respectively. As will be apparent to a person skilled in the art, various elements of the period measurement and angle generator are also shown in FIG. 15.

The outputs of this block are:
at_angle_clock, with polarity controlled by ATPHP (register),
at_angle[9:0] data,
at_period_clock, with polarity control ATPRP (register), and
the period and angle interrupts.

There are two types of input to module 1400 as shown in FIG. 14: the primary input ATSIG, and the capture logic input signals at_capture[x]. All signal and capture inputs are synchronized to the module clock using edge-detection logic similar to that shown in FIG. 16. The missing pulse detector is illustrated in FIG. 15. The logic compares the current period counter value with the latched value from the previous cycle (ATxPER), creating a signed difference. When the difference is equal to the ATxMISS register, a missing pulse is declared. The at_missed_pulse output is pulsed in all ATMD modes, with a corresponding interrupt.

When missing pulse detection is disabled in the ATMD mode register, every input pulse is considered the "end of period", and a period clock pulse is generated.

When missing pulse detection is enabled, the period clock is generated only after the missing pulse counter and ATxMISS register are equal, and the period latch update is not performed. All other input pulses latch period data.

It is allowed that a negative value can be set in ATxMISS register, the low byte must be written last; the upper byte is shadowed to guarantee atomic updates. Note, the missing pulse delay is measured in time (clock cycles) and not in degrees, because the period counter is used as the reference. Generally speaking, the missing pulse detector only fires once, and then requires a legitimate input edge to reset itself. This is an automatic behavior, because the period counter will max-out at FFFF and not again be equal to ATxMISS.

Figure 18:
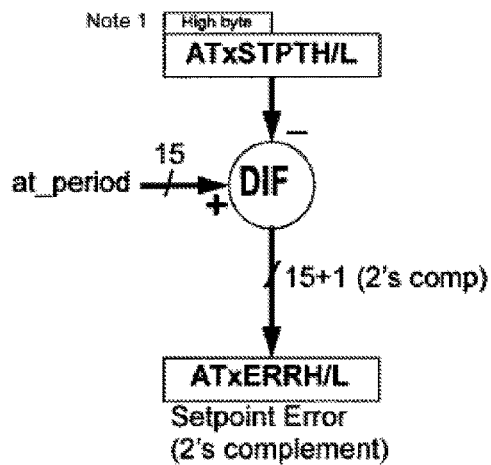
FIG. 18 shows a setpoint error feature of the angular timer peripheral of FIG. 14.

As shown in FIG. 18, the user may enter a setpoint value in register ATxSTPT. The setpoint is subtracted from the measured period register ATxPER to produce register ATxERR.

Figure 19:
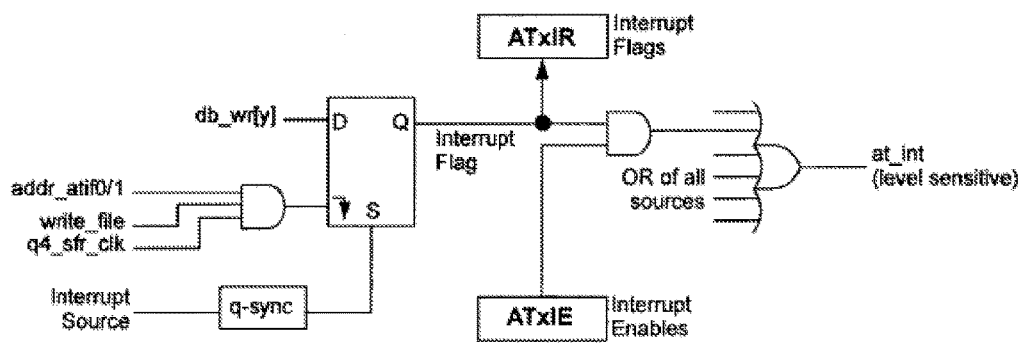
FIG. 19 shows an interrupt logic of the angular timer peripheral of FIG. 14.
Figure 20:
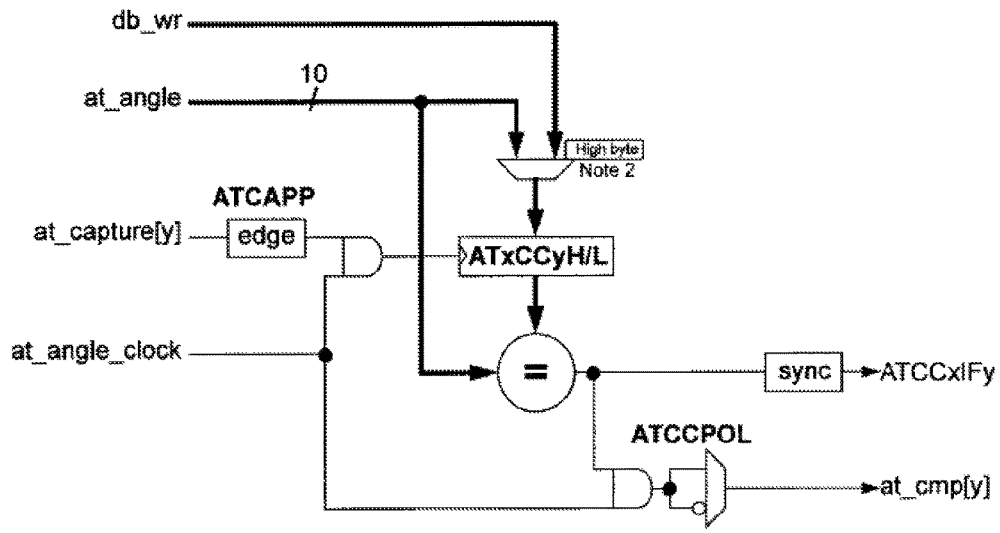
FIG. 20 shows compare and capture logic of the angular timer peripheral of FIG. 14.

An embodiment of an interrupt logic for generating an interrupt is shown in FIG. 19. An embodiment of the compare and capture logic is illustrated in FIG. 20, these features provide:
input synchronization, and
report inhibit.

According to an embodiment, when writing register ATxCCy, the low byte must be written last; the upper byte is shadowed to guarantee atomic updates.

The following section describes the operation in the single-pulse per revolution mode.

Figure 25:
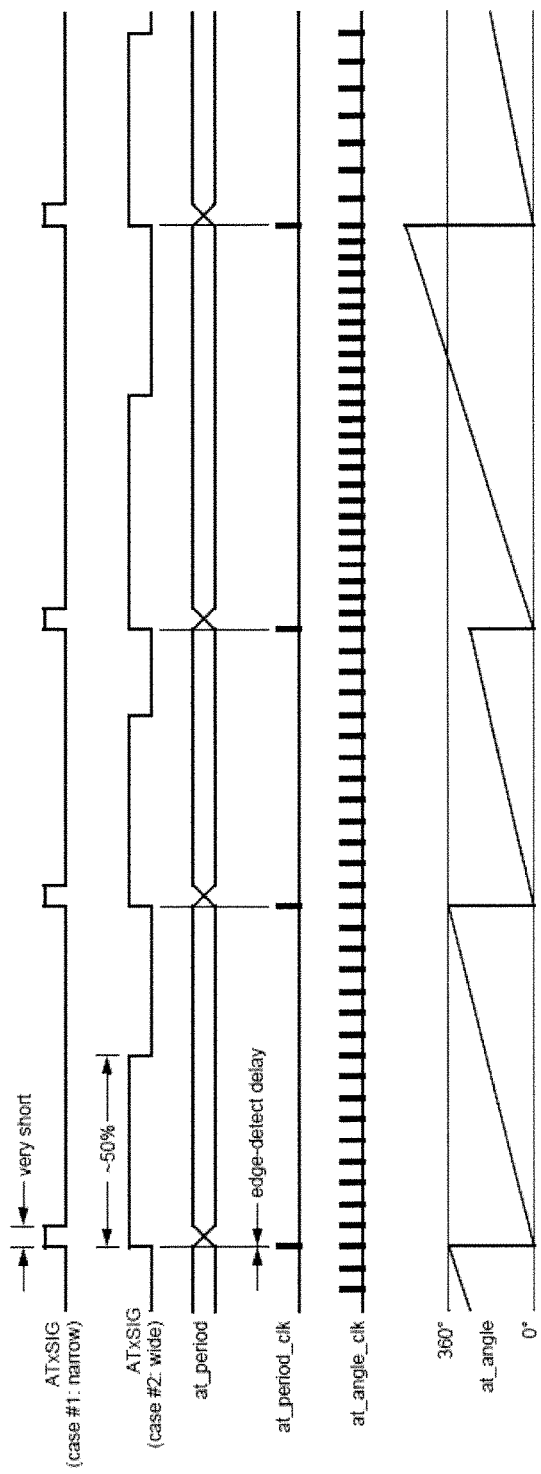
FIG. 25 shows a timing diagram for mode ATMD=00.

The basic operation is illustrated in FIG. 25. As shown in FIG. 15, the angular timer includes two divider chains, and both measure the period of the input signal.

The first chain (FIG. 16) divides clock_in by the user-specified ATxRES value stored in the respective register. The resulting clock (clock_in/ATRES) is used to clock a counter. At the end of the input period (that is, the next active edge of signal_in), the value given by Equation 1 is latched into register ATxPER, and an interrupt is signaled (except when inhibited).

$$ATxPER = \frac{F(\text{clockIn}) \cdot \text{Period}(\text{signal})}{ATxRES} \qquad \text{(Equation 1)}$$

or $$ATxPER = \frac{\left(\frac{F(\text{clockIn})}{F(\text{signal})}\right)}{ATxRES}$$

At the same time, the second chain (FIG. 17) divides clock_in by register ATxPER, which holds the value measured in the previous cycle. The resulting clock (clock_in/ATPER) clocks the counter which may be read as ATxANG. By the same reasoning used for ATxPER, the angle counter (if theoretically sampled at the end of the period) will be as shown in Equation 2.

$$ATxANG(\text{final}) = \frac{F(\text{clockin}) \cdot \text{Period}(\text{signal})}{ATxPER} \qquad \text{(Equation 2)}$$

Comparing Equation 1 and Equation 2 will show that ATxANG should count from zero to a value equal to ATxRES during the ATSIG period. Therefore, the clock to the ATANG counter can be seen to have a frequency of F(signal)·A TRES, which is the required angle clock.

Note that, if the input period changes, the angle clock period will not change until the next cycle. It follows that, at the end of a cycle, the value in ATxANG may be more or less than ATxRES. Realize also that the ATxANG counter is not required for the generation of at_angle_clock. The counter is a module feature that allows for the capture and compare logic, and for the user to monitor instantaneous input angle.

When ATSIG represents the rotation of a machine or the AC mains, the input is understood to provide 1 active edge every 360 degrees. Since the angle clock equally divides the signal period, the clock also divides the 360 degree period of rotation, and each clock pulse marks a fixed angle of that rotation, AR (Equation 3).

$$AR = \frac{360°}{ATRES} \qquad \text{(Equation 3)}$$

Figure 26:
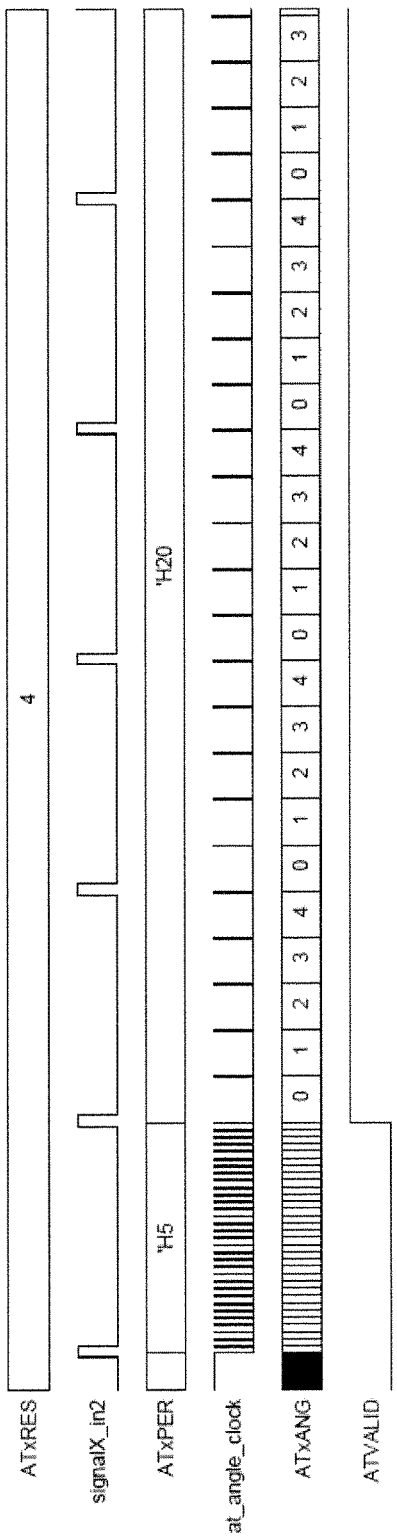
FIG. 26 shows a timing diagram for an example operation with ATxRES=5.

ATxANG is cleared to zero at the start of the rotation (that is, at the at_period_clk pulse), and then counts up throughout the cycle, so the value of the counter is linearly related to the instantaneous phase angle as shown in Equation 4. A timing example is shown in FIG. 26, with ATxRES=5, making an angle clock pulse every 360/5=72 degrees.

$$\text{angle} = ATxANG \cdot AR = 360° \cdot \frac{ATxANG}{ATRES} \qquad \text{(Equation 4)}$$

The value of ATRES determines the resolution of the period measurement and strongly affects the timing of the angle clock at the end of each revolution. When ATRES is small, ATxPER will count to a high value. ATxPER truncates the actual period value, so the inherent accuracy is +0/−1 counts, multiplied by ATRES (because period is measured in increments of ATRES). Counting to a high ATxPER means the error is a smaller percentage of the total. When ATRES is large (say, 720), the value in ATxPER will be small, and the truncation will be a significant error source. The truncation error accumulates in the angle pulse position, with each arriving more early than its predecessors. If ATRES is large, the last period clock could be early by many clocks. The practical issue here is that reading ATxANG and applying Equation 2-4 can often produce a value that is >360°.

A small ATxRES is advantageous for accuracy, but may not meet system requirements. The figure-of-merit of the system is defined as the minimum expected ATxPER value, and Equation 1 may be rewritten as Equation 5. It is recommended that for good operation, select clock_in and ATxRES to give FOM>500.

As Equation 1 shows, a high-frequency clock_in will produce higher counts, and lower percentage error, at the expense of higher system power. If ATxPER overflows, the ATPOV bit will be set in a control register, and the value of ATxPER will not be updated (it follows that ATVALID may remain unset until the 3rd signal cycle).

$$FOM = ATxPER(min) = \frac{\left(\frac{F(clockIn, min)}{F(signal, max)}\right)}{ATRES} \quad \text{(Equation 5)}$$

When the signal at ATSIG is lost, the period counter will overflow and ATPOV becomes 1. However, there is no period interrupt, and the value in ATxPER is not updated, so the angle clock frequency will not change. Eventually even ATxANG will overflow, and ATVALID will become 0. Note, the missing pulse detector should be used to detect loss of input and create an interrupt. The time-out value will be (a) guaranteed, and (b) much shorter than can be achieved by waiting for ATxANG overflow.

The angle clock output is not accurate until the input period has been correctly sampled, which requires at least two complete input cycles (see the example in FIG. 26). Accordingly, the angle clock is gated off while ATVALID=O, the angle counter will not advance, and no angle interrupt will occur. ATVALID is held at O whenever ATEN=O or ATxRES=O, or becomes O because of:
  any reset (including cfg_at_en=0),
  any write to ATxRES (Register 1-1),
  angle counter overflow, or
  freeze (freeze=1).

ATVALID becomes 1 upon the third ($3^{rd}$) active input edge of the signal that latches ATxPER. While ATVALID=0, the following features are inhibited:
  period clock output and interrupts,
  missed-pulse pulse output and interrupts,
  angle clock output and interrupts,
  angle counter counting,
  capture logic and associated interrupt,
  compare logic and associated interrupt.

Also, while ATVALID=0, every input edge captures the period duration, ignoring the missing pulse detector, so that a baseline measurement can be established. In other words, when the system is just starting up, every input cycle is captured into ATxPER no matter which ATMD is selected.

Figure 27:
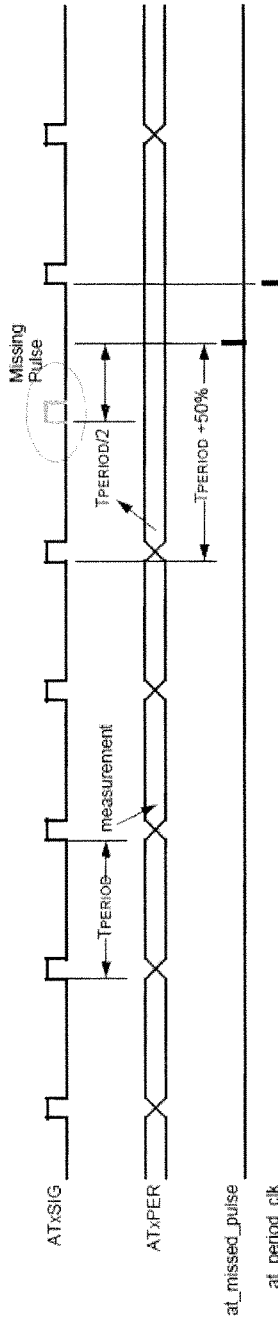
FIG. 27 shows a table with various operating modes according to register ATMD and a timing diagram for mode ATMD=00.

The operating modes are summarized in FIG. 27
Single-Pulse Per Revolution
ATMD=00

The motor sensor or zero-cross detector provides exactly one pulse for each revolution as shown in FIG. 25. Every ATSIG resets the Period and Angle counters, and the period is measured with each input cycle.

ATRES is set to produce the required angular resolution. This is the basic timing mode described above. The at_missed_pulse output and associated interrupt are active, but have no effect on operation or the other module outputs.
Multi-Pulse Per Revolution, Fixed-Time Missing Pulse
ATMD=01

Figure 28:
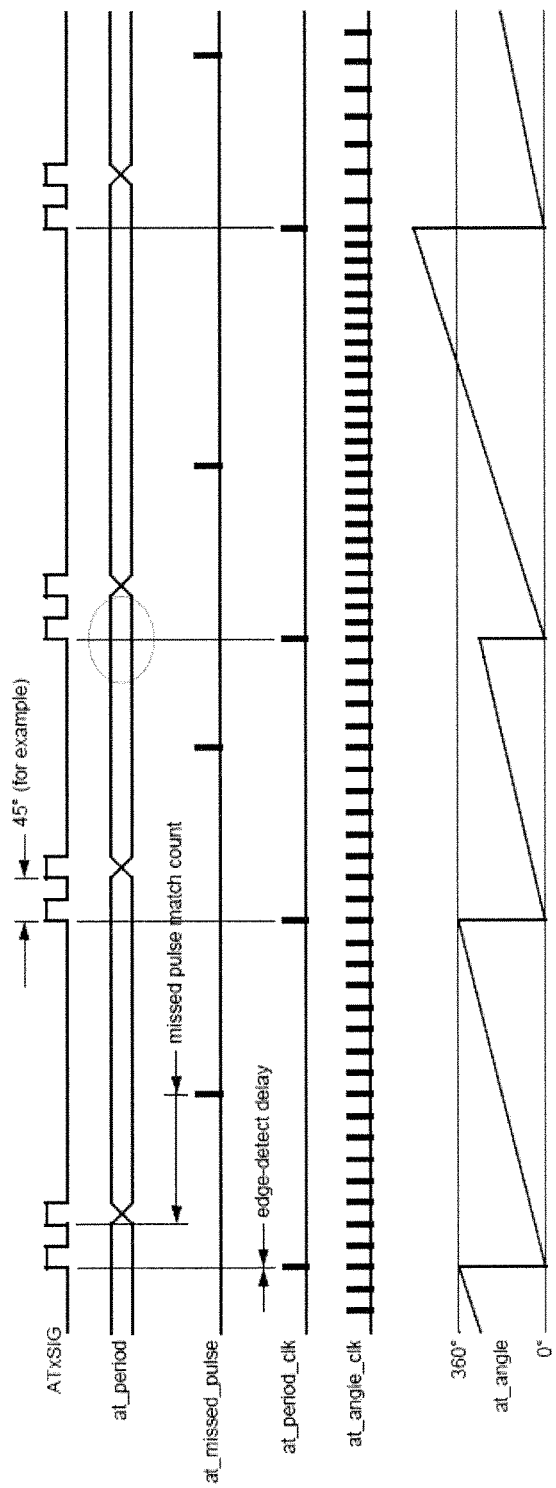
FIG. 28 shows a timing diagram for mode ATMD=01.

The motor sensor provides more than one pulse for each revolution. For the case shown in FIG. 28, the motor sensor pulses twice for each revolution, at a known angular difference. The first pulse is assumed as the "top dead center" (TDC) reference, and the $2^{nd}$ pulse is used to measure the (partial) period.

Figure 29:
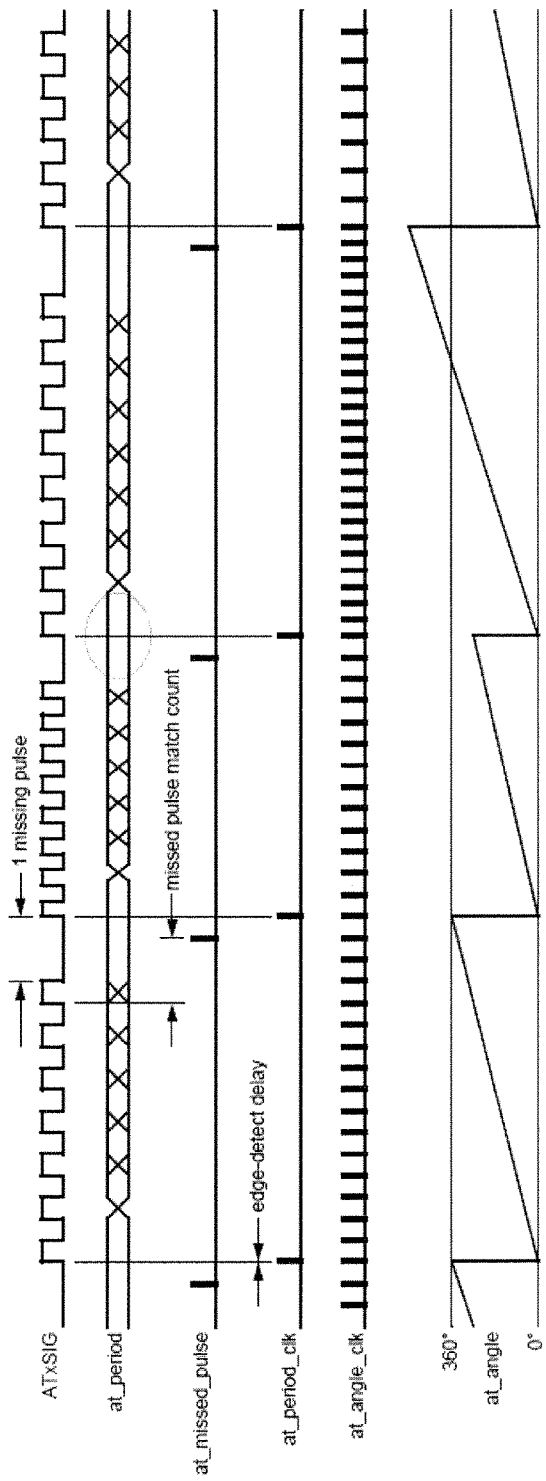
FIG. 29 shows a timing diagram for mode ATMD=11.

The signal pattern of FIG. 29 is typically taken from the flywheel of an internal combustion engine. It is not uncommon to have more than 200 teeth on flywheel, and a pulse appears for all-but-1 tooth gap at the final tooth. The period counter measures the tooth-to-tooth duration except at the gap. The first pulse after the gap signals TDC.

While ATVALID=0, all input edges update ATxPER, and the missing pulse detector is ignored in order to establish a baseline period measurement:

Because so many pulses are occurring on ATSIG, the value of ATRES must be set fairly low to achieve a suitable FOM. A reasonable value may be less than 5. Equation 3 is restated as Equation 6 to include the effect of the teeth. ATRES must also be small because ATxANG will count up to the value of ATRES·TEETH, which must remain below 1023 (10 bits), even when the motor speed is slowing.

$$AR = \frac{\left(\frac{Degrees}{Tooth}\right)}{ATRES} \quad \text{(Equation 6)}$$

Adaptive Single Pulse
ATMD=10

This mode is identical to ATMD=00, except that the value in ATxMISS is not used. The missing pulse timeout is one half of the current measured period, as shown in the timing diagram of FIG. 27, and will track changing motor speed. I Note: The value in ATxMISS is not changed.
Multi-Pulse Per Revolution, Adaptive Missing Pulse
ATMD=11

This mode is identical to ATMD=01, except that the value in ATxMISS is not used. The missing pulse timeout is one half of the current measured period, as shown in the timing diagram FIG. 27, and will track changing motor speed. Note: The value in ATxMISS is not changed.
Output Applications The primary output of the module is the angle clock, at_angle_clock. Most applications will also require the period clock as a "zero" or "top dead center" reference.
Angle Counter To simplify device logic, the module includes the angle counter, which uses both signals. This counter is illustrated in FIG. 16 and described above.

PWM Generation

The compare registers of FIG. 20 generate an output signal at specified values of ATxANG. Given a required phase angle, use Equation 4 or Equation 6 and solve for the value of ATxANG that represents that angle. Three applications of the compare outputs are illustrated.

Figure 21:
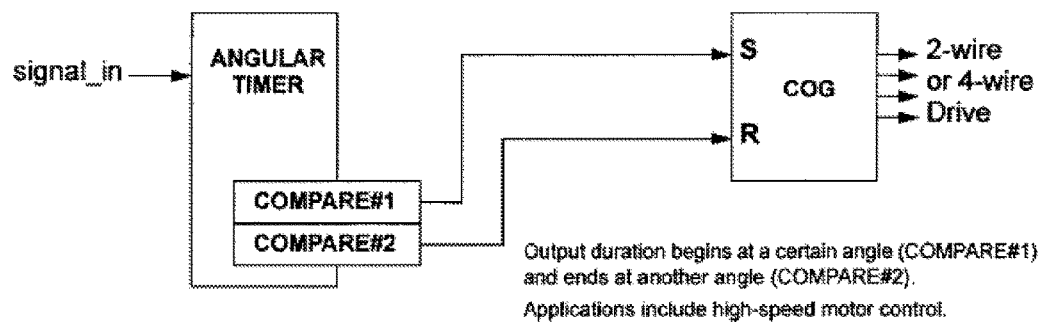
FIG. 21 shows a first complementary output generator (COG) application, for example in a high speed motor control.

1. In devices with COG (FIG. 21), the start and stop angles of the output pulse can be set using separate compare registers.

Figure 22:
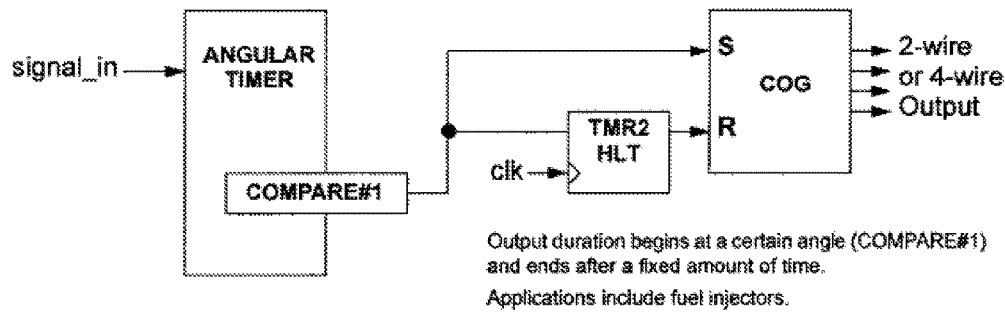
FIG. 22 shows a second COG application, for example in a fuel injector application.

2. A fixed-duration output is often useful when valves must be opened, to deliver a fixed volume of product. FIG. 22 shows a COG system where the start angle is set, and the output duration is determined by a TMR2+HLT with a separate timer clock.

Figure 23:
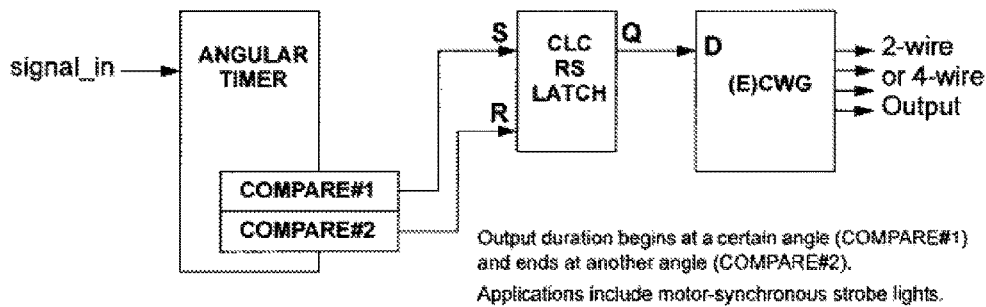
FIG. 23 shows a configurable logic cell (CLC)/configurable waveform generator (CWG) application, for example, in a motor synchronous strobe light system.

3. FIG. 23 is similar to #1, but uses the RS flop in a CLC to generate the output pulse in a device that has only a CWG. The CLC is also useful for cases where software must be involved in enabling or disabling the output.

Duty Cycle Measurement

Figure 24:
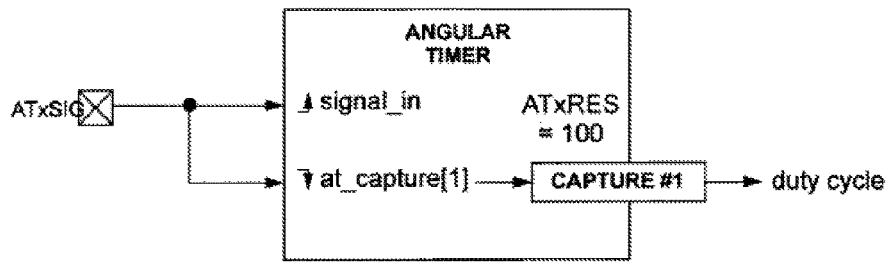
FIG. 24 shows a pulse duty cycle measurement example, for example for a fan controller application.

When ATxRES=100, the capture/compare feature can be interpreted as percentage of a cycle. If the period-input signal is applied to a capture input, and the capture polarity is falling edge (FIG. 24), the captured value will indicate the duty-cycle of the input signal. The missing pulse detector can indicate if the input has been lost. This application will work regardless of the input frequency, so long as it is relatively constant and not DC. It is also immune to oscillator calibration errors.

Hence, the various embodiments disclosed can be used for commutation of motor windings, generating a pulse of fixed fraction, for example as a type of pulse width modulation, switching something on at a specific fraction such as persistence of vision propeller displays, the timing of output changes during sine wave generation, which, for example, may use a digital-to-analog converter and does not have to use pulse width modulation, etc.

What is claimed is:

1. A system comprising:
a digital period divider generating an output signal that is proportional to an angle defined by a rotational input signal comprising a plurality of subsequent pulses, wherein the digital period divider comprises
a first counter comprising N bits, with R least significant bits (LSB) and P most significant bits (MSB), a count input, and a reset input, wherein the count input receives a reference clock signal and the reset input receives the rotational input signal, wherein R and P are integer numbers greater than 1 and R+P=N;
a latch having P bits and being coupled with the P most significant bits of the first counter;
a second counter having P bits comprising a count input and a reset input, wherein the count input receives the first clock signal; and
a first comparator operable to compare the P bits of the latch with the P bits of the second counter and generating an output signal, wherein the output signal is also fed to the reset input of the second counter;
an interval measurement unit determining an interval time of an interval defined by succeeding pulses of the output signal; and
a missing pulse detector operable to compare a current interval with a parameter to determine whether a pulse is missing in the rotational input signal.

2. The system according to claim 1, wherein the parameter is a predetermined time value.

3. The system according to claim 1, wherein the parameter is defined by a previously measured interval and a predetermined factor.

4. The system according to claim 1, wherein the system is programmable to determine whether a pulse is missing in the rotational input signal in which case enabled missing pulse signal is generated.

5. The system according to claim 4, wherein a sensor providing the rotational input signal is selected from the group consisting of a zero-cross detector, a notched wheel sensor, a double-notched wheel sensor and a flywheel teeth sensor.

6. The system according to claim 1, further comprising an output generating the missing pulse.

7. The digital period divider according to claim 1, wherein the first counter comprises an MSB counter and an LSB counter connected in series, wherein the LSB counter is a modulo counter.

8. The digital period divider according to claim 1, wherein the reference clock signal is a known system clock and the rotational input signal is a signal having an unknown frequency smaller than the frequency of the reference clock signal.

9. The system according to claim 1, and further comprising:
a third counter having P bits and comprising a reset input and a count input, wherein the reset input receives the rotational input signal and the count input receives the output signal of the first comparator;
a user value register;
a second comparator operable to compare the value of the third counter and the user value register; and
a flip-flop having a set and reset input, wherein the set input receives the reference clock signal and the reset input receives an output signal of the second comparator.

10. The system according to claim 9, wherein the rotational input signal is generated by a sensor coupled with a motor which generates at least one pulse per full rotation of the motor shaft.

11. The system according to claim 10, wherein the sensor is a Hall or optical sensor.

12. A method for dividing a period of an unknown frequency, comprising:
receiving an input signal comprising a series of index pulses;
measuring a time between two successive index pulses by means of a first counter having N bits with P most significant bits and R least significant bits and being clocked by a system clock having a frequency higher than a frequency of the input signal, wherein R and P are integer numbers greater than 1 and R+P=N;
latching the P most significant bits, and
comparing the latched value with a second counter being clocked by the system clock and generating output pulses when the second counter is equal to the latched most significant bits;
comparing a current interval with a parameter to determine whether a pulse is missing in the input signal; and
generating a missing pulse signal if the missing pulse is detected.

13. The method according to claim 12, wherein the parameter is a predetermined time value.

14. The method according to claim 12, wherein the parameter is defined by a previously measured interval and a predetermined factor.

15. The method according to claim 12, comprising the step of selecting a type of input signal which enable or disable a missing pulse detection.

16. The method according to claim 12, wherein the first counter comprises an MSB counter and an LSB counter connected in series, wherein the LSB counter is a modulo counter.

17. The method according to claim 12, further comprising generating a pulse width modulation (PWM) signal from the output pulses.

18. The method according to claim 12, wherein the index pulse is generated by a rotary machine, and wherein the measured period is a period of rotation.

19. The method according to claim 17, comprising
clocking a third counter having P bits with the index pulses and resetting the third counter with the output pulses;
compare a value of the third counter with a user value; and
setting a flip-flop with the index pulses and resetting the flip-flop when the third counter is equal the user value.

20. The method according to claim 19, wherein the index pulses are generated by a sensor coupled with a motor.

21. The method according to claim 20, wherein the sensor is selected from the group consisting of a zero-cross detector, a notched wheel sensor, a double-notched wheel sensor and a flywheel teeth sensor.

22. The method according to claim 20, wherein the sensor generates at least one pulse per full rotation of a motor shaft.

23. The method according to claim 22, wherein the sensor is a Hall or optical sensor.

24. A system comprising:
a digital period divider generating an output signal that is proportional to an angle defined by a rotational input signal, wherein the digital period divider comprises
a first counter comprising N bits, with R least significant bits (LSB) and P most significant bits (MSB), a count input, and a reset input, wherein the count input receives a reference clock signal and the reset input receives the rotational input signal, wherein R and P are integer numbers greater than 1 and R+P=N;
a latch having P bits and being coupled with the P most significant bits of the first counter;
a second counter having P bits comprising a count input and a reset input, wherein the count input receives the first clock signal; and
a first comparator operable to compare the P bits of the latch with the P bits of the second counter and generating an output signal, wherein the output signal is also fed to the reset input of the second counter; and
an interval measurement unit determining an interval time of an interval defined by succeeding pulses of the output signal.

25. The system according to claim 24, further comprising a missing pulse detector operable to compare a current interval with a parameter to determine whether a pulse is missing in the rotational input signal, and wherein the system is programmable to generate a missing pulse signal when the missing pulse detector detects said missing pulse.

26. The system according to claim 25, wherein the sensor providing the input signal is selected from the group consisting of a zero-cross detector, a notched wheel sensor, a double-notched wheel sensor and a flywheel teeth sensor.

27. The digital period divider according to claim 24, wherein the first counter comprises an MSB counter and an LSB counter connected in series, wherein the LSB counter is a modulo counter.

28. The digital period divider according to claim 24, wherein the first clock signal is a known system clock and the second clock signal is a signal having an unknown frequency smaller than the system clock.

29. The system according to claim 24, and further comprising:
a third counter having P bits and comprising a reset input and a count input, wherein the reset input receives the second clock signal and the count input receives the output signal of the first comparator;
a user value register;
a second comparator operable to compare the value of the third counter and the user value register; and
a flip-flop having a set and reset input, wherein the set input receives the first clock signal and the reset input receives an output signal of the second comparator.

30. The system according to claim 29, wherein the second clock signal is generated by a sensor coupled with a motor which generates at least one pulse per full rotation of the motor shaft.

31. The system according to claim 30, wherein the sensor is a Hall or optical sensor.

* * * * *